United States Patent
Langner et al.

(10) Patent No.: US 8,196,016 B1
(45) Date of Patent: Jun. 5, 2012

(54) TRAPPING SET DECODING FOR TRANSMISSION FRAMES

(75) Inventors: Paul Langner, Fremont, CA (US); Ramin Shirani, Morgan Hill, CA (US)

(73) Assignee: Aquantia Corporation, Milpitas, CA (US)

( * ) Notice: Subject to any disclaimer, the term of this patent is extended or adjusted under 35 U.S.C. 154(b) by 0 days.

(21) Appl. No.: 13/190,288

(22) Filed: Jul. 25, 2011

Related U.S. Application Data

(63) Continuation-in-part of application No. 12/329,514, filed on Dec. 5, 2008, now Pat. No. 8,020,070.

(60) Provisional application No. 60/992,457, filed on Dec. 5, 2007.

(51) Int. Cl.
*H03M 13/00* (2006.01)

(52) U.S. Cl. .......... 714/758; 714/762

(58) Field of Classification Search .......... 714/758, 714/762
See application file for complete search history.

(56) References Cited

U.S. PATENT DOCUMENTS

| | | | | |
|---|---|---|---|---|
| 4,414,667 A * | 11/1983 | Bennett | | 714/783 |
| 4,584,685 A * | 4/1986 | Gajjar | | 714/751 |
| 4,592,054 A * | 5/1986 | Namekawa et al. | | 714/761 |
| 4,782,490 A * | 11/1988 | Tenengolts | | 714/756 |
| 5,107,506 A * | 4/1992 | Weng et al. | | 714/762 |
| 5,420,873 A * | 5/1995 | Yamagishi et al. | | 714/761 |
| 6,640,327 B1 * | 10/2003 | Hallberg | | 714/785 |
| 6,754,856 B2 * | 6/2004 | Cofler et al. | | 714/53 |
| 7,058,873 B2 * | 6/2006 | Song et al. | | 714/752 |
| 7,231,577 B2 * | 6/2007 | Richardson et al. | | 714/758 |
| 7,237,181 B2 * | 6/2007 | Richardson | | 714/780 |
| 7,325,174 B2 | 1/2008 | Choi et al. | | |
| 7,340,671 B2 * | 3/2008 | Jones et al. | | 714/800 |
| 7,370,243 B1 * | 5/2008 | Grohoski et al. | | 714/48 |
| 7,421,015 B2 | 9/2008 | Sedarat | | |
| 7,433,395 B2 * | 10/2008 | Sedarat | | 375/222 |
| 7,502,986 B2 * | 3/2009 | O'Neill et al. | | 714/769 |
| 2005/0144543 A1 * | 6/2005 | Choi et al. | | 714/704 |
| 2005/0193320 A1 * | 9/2005 | Varnica et al. | | 714/800 |

OTHER PUBLICATIONS

Richardson, T., "Error Floors of LDPC Codes", Flarion Technologies, 1426-1435.
Winstead, C., "Fast BER Simulation: Using Importance Sampling in Error Control System", (2003) 1-14.
Jones, C., et al., "The Universality of LDPC Codes on Wireless Channels", (2003) IEEE, 440-445.
Lee, D., et al., "A Hardware Gaussian Noise Generator for Channel Code Evaluation", (2003) Proc. 11th Ann. IEEE Symposium on Field-Programmable Custom Computing Machines, 10 pgs.
Jones, C., et al., "Robustness of LDPC Codes on Periodic Fading Channels", (2002) IEEE, 1284-1288.

* cited by examiner

*Primary Examiner* — James C Kerveros
(74) *Attorney, Agent, or Firm* — Lance M. Kreisman, Esq.; Mahamedi Paradice Kreisman LLP

(57) ABSTRACT

Trapping set decoding for transmission frames is disclosed. In one aspect, a trapping set decoder includes a detector including an input to receive a decoded codeword and including circuitry to detect the presence of one or more trapping sets of bits in the decoded codeword. A selection processor is coupled to the detector to select one from a group of trapping sets and correct one or more bits in the decoded codeword based on statistical measures associated with the one or more trapping sets of bits.

16 Claims, 8 Drawing Sheets

|   | 0 | 1 | 2 | 3 | 4 | 5 |
|---|---|---|---|---|---|---|
| 5 | 011 | 111 | 100 | 000 | 011 | 111 |
| 4 | 001 | 010 | 110 | 101 | 001 | 010 |
| 3 | 100 | 000 | 011 | 111 | 100 | 000 |
| 2 | 110 | 101 | 001 | 010 | 110 | 101 |
| 1 | 011 | 111 | 100 | 000 | 011 | 111 |
| 0 | 001 | 010 | 110 | 101 | 001 | 010 |

FIG. 7

TRAPPING SET DECODING FOR TRANSMISSION FRAMES

CROSS-REFERENCE TO RELATED APPLICATIONS

This application is a Continuation-in-Part (CIP) of application Ser. No. 12/329,514, filed Dec. 5, 2008, now U.S. Pat. No. 8,020,070, issued Sep. 13, 2011, entitled "Trapping Set Decoding for Transmission Frames," and claims the benefit of U.S. Provisional Application No. 60/992,457, filed Dec. 5, 2007, entitled, "Trapping Set Decoder for the IEEE 10 GBASE-T LDPC Code," all of which are incorporated herein by reference.

TECHNICAL FIELD

The disclosure herein relates generally to electronic communications, and more particularly to decoding received data in electronic communications.

BACKGROUND

Communication of information between computers and other electronic devices can be implemented using any of a variety of different standards and technologies. Channel coding and error correction techniques can be used to reduce errors in received signals introduced from distortion and other disturbances. Such coding and error correction can be implemented using an encoder and a decoder at the ends of the transmission channel.

One increasingly popular communication standard is 10 Gigabit Ethernet, with a nominal data rate of 10 Gbit/s. One standard of 10 Gigabit Ethernet is IEEE 10 GBASE-T, used to provide 10 gigabit per second connections over unshielded or shielded twisted pair cables. The wire-level modulation for 10 GBASE-T is a Tomlinson-Harashima Precoded (THP) version of pulse-amplitude modulation with 16 discrete levels (PAM-16), encoded in a two-dimensional constellation pattern known as 128-DSQ (Double Square QAM).

As shown in FIG. 1, the 10 GBASE-T transmission frame is based on a (2048, 1723) Low Density Parity Check (LDPC) code, i.e. 2048 total bits with 1723 data bits and 325 check bits per frame, where the check bits are used to fix or detect errors in the frame. This is used in combination with the 128-DSQ synthetic constellation that uses a combination of coded and uncoded bits to transmit information. As shown, Ethernet data is retrieved in fifty 65-bit blocks and is scrambled, e.g. provided to a self-synchronizing scrambler to scramble the bits, and a CRC-8 generation of 8 check bits is provided on one end of the frame and an auxiliary channel bit on the other end, creating 3259 bits in the frame payload. The payload is then divided up into 1723 bits for the LDPC coder, and 1536 uncoded bits (3×512) that are not coded by the LDPC coder. The coded LDPC check bits (325 bits) are added to the end of the payload. The LDPC block size after coding is 2048 total bits (4×512).

The resulting frame is mapped to 128-DSQ symbols, and the resulting DSQ symbols are then precoded using THP. Each of these 512 128-DSQ symbols are then transmitted as a pair of PAM-16 symbols (x-axis and y-axis), to create 1024 symbols (3584 bits). The constellation for 128-DSQ symbols is shown in FIG. 2, and consists of 8 cosets (regions), each coset containing 16 points. The coset label contains the 3 uncoded bits as shown in FIG. 2, and the points within the coset contain the 4 coded bits protected using the LDPC block code. The labeling of the points in the coset (the coset elements) conveying the 4 coded bits is shown in FIG. 3.

The receiver unscrambles a received frame and decodes the coded bits. Any of several decoding algorithms for LDPC codes can be used in the receiver to decode the received coded bits. For example, iterative decoders are often used to converge on a correct decoded value. In one implementation, LDPC decoding is performed in the receiver using a soft-decision, message-passing algorithm. The bits are treated as continuous variables which represent the probability of the value being a 0 or a 1, and the continuous variables are represented in the decoding algorithm as Log Likelihood Ratios (LLRs). The message passing algorithm sets the variable nodes to the soft receive LLRs, calculates the syndrome LLRs given the variable LLRs, updates the variable LLRs with the new syndrome information, and iterates in this same way until a convergence is reached (e.g., check bits are zero). Using the 10 GBASE-T transmission scheme, it is possible to have very low bit error rates that come very close to the Shannon limit of the communication channel.

However, one of the problems that is inherent to LDPC codes is the presence of trapping sets. A trapping set is the set of data nodes (bits) that cannot always be decoded to the correct value after any given number of iterations. These are stable solutions to the LDPC decoding problem that typically manifest themselves in a cluster of interconnected nodes, such that the influence from outside these nodes is limited, i.e. they are a set of variable nodes not well-connected to the rest of the graph and causing a failure in decoding. Thus, during the decoding operation it is possible to get "stuck" in a trapping set, as opposed to converging to the correct solution, causing the decoding operation to fail and setting the ultimate error floor of the decoding process. There have been attempts to bias the decoding process to avoid trapping sets, but when encountered, the trapping sets cause the decoding to fail. Failed decoding of the frame leads to undesired retransmission of the frame or undesired noise at the receiver.

Accordingly, what is needed is a system and method that addresses decoding issues of trapping sets.

BRIEF SUMMARY

Trapping set decoding for transmission frames is disclosed. In one aspect, a trapping set decoder includes a detector including an input to receive a decoded codeword and including circuitry to detect the presence of one or more trapping sets of bits in the decoded codeword. A selection processor is coupled to the detector to select one from a group of trapping sets and correct one or more bits in the decoded codeword based on metrics associated with the one or more trapping sets of bits.

The embodiments disclosed herein allow decoding to performed even with the presence of trapping sets. This allows the error floor in decoding caused by trapping sets to be eliminated.

BRIEF DESCRIPTION OF SEVERAL VIEWS OF THE DRAWINGS

FIG. 7 illustrates an uncoded bit slicing lookup table associated with the uncoded bit slicing described herein;

DETAILED DESCRIPTION OF THE INVENTION

Figure 1:
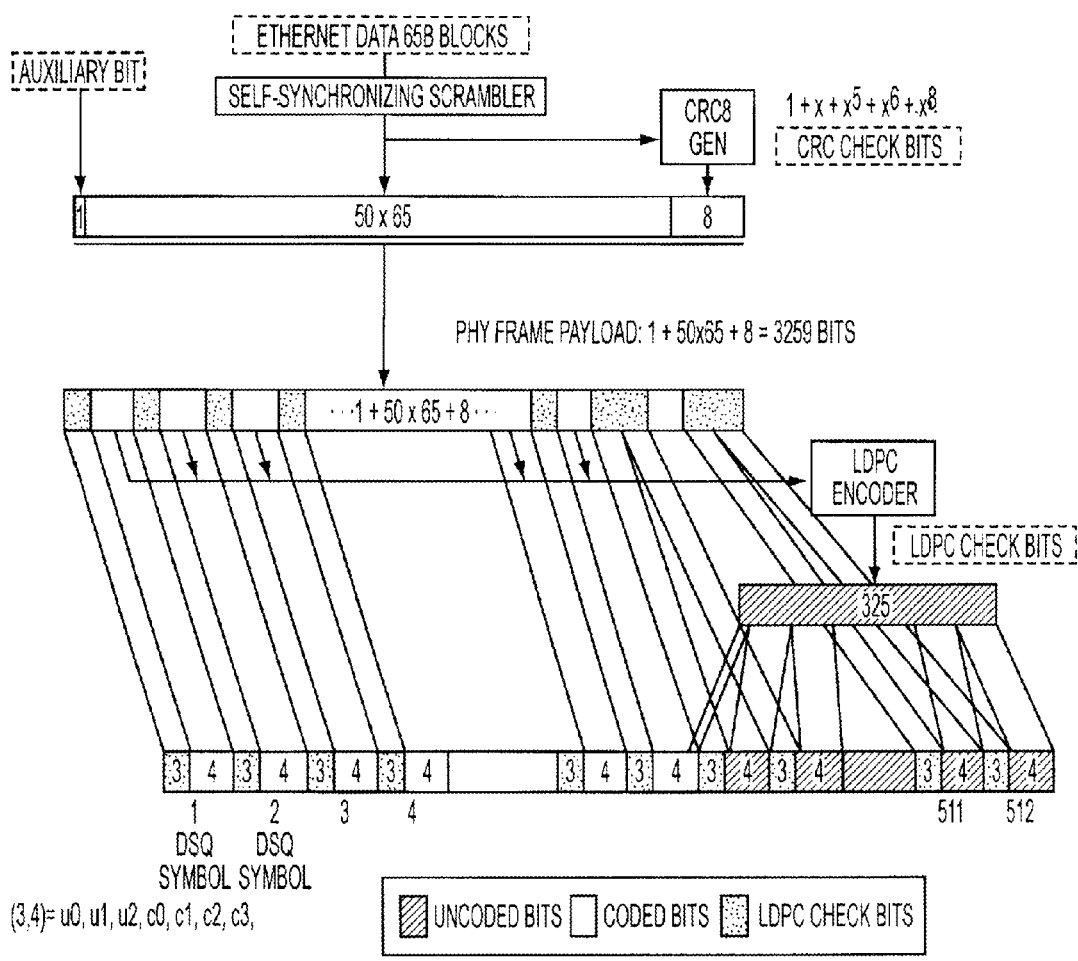
FIG. 1 illustrates a transmission frame for the 10 GBASE-T communication standard.

The disclosure herein relates generally to electronic communications and more particularly to decoding received data in electronic communications. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The embodiments disclosed herein describe systems and methods for decoding trapping sets resulting from the decoding of encoded data in transmission frames. The exemplary embodiments are described with reference to the IEEE 10 GBASE-T standard, including LDPC-encoded data. However, the disclosure herein is suitable for other standards and encoded data having equivalent parameters and characteristics.

The LDPC coding and decoding method used for LDPC bits for the 10 GBASE-T transmission frame has a set of trapping set characteristics, described below:

1) There are 14,272 trapping sets of Order 8.
2) Associated with these 14,272 trapping sets are 2328 check node signatures.
3) Each check node signature represents either 4, 8, 12, or 16 different trapping sets.

There are:
   a) 1312 signatures with only 4 associated trapping sets;
   b) 824 signatures with only 8 associated trapping sets;
   c) 160 signatures with only 12 associated trapping sets;
   d) 32 signatures with only 16 associated trapping sets.

4) All trapping set check node signatures are confined to one of the six 64-element blocks of check nodes from the original RS-based H-matrix.

In addition to the Order 8 trapping sets noted above, the inventor has discovered 3844 trapping sets of Order 10, or sequences of 10 bits. Associated with these 3844 trapping sets are 3762 check node signatures that correspond to either 1 or 2 different Order 10 trapping sets.

The particular trapping sets and check node signatures possible in an implementation may vary depending on the particular coding/decoding method and parameters used. Trapping sets and check node signatures can be determined, for example, by determining what the check bit signatures and trapping sets are when the decoder fails due to a trapping set. Patterns can be determined therefrom and in how the failing check bits are connected in the decoding process, and can be searched for in the decoding method to find the possible trapping sets for a particular coding/decoding method and parameters (if applicable), as for the LDPC decoding for 10 GBASE-T described herein.

According to the inventive embodiments disclosed herein, given the ability to read a check node signature corresponding to a trapping set from the check nodes during the LDPC decoding operation, it is then possible to halt the decoding operation as soon as a trapping set signature is detected. Then, knowing the trapping set corresponding to this signature, it is possible to flip bits of the codeword based on the bits of the trapping set and complete the decoding operation successfully. Various embodiments described herein present different ways to determine the trapping set responsible for generating the error signature.

When a check node signature corresponds to a multiplicity of trapping sets, as described above, a mechanism for distinguishing between these trapping sets is needed. One embodiment described herein uses validity checks to distinguish the trapping set. The IEEE 10 GBASE-T line code, for example, includes a mechanism that can be used in one embodiment herein, in the form of the CRC-8 frame check. Using this CRC-8 as an outer check code, the correct trapping set can be selected from the collection of trapping sets associated with a given check node signature.

Figure 4:
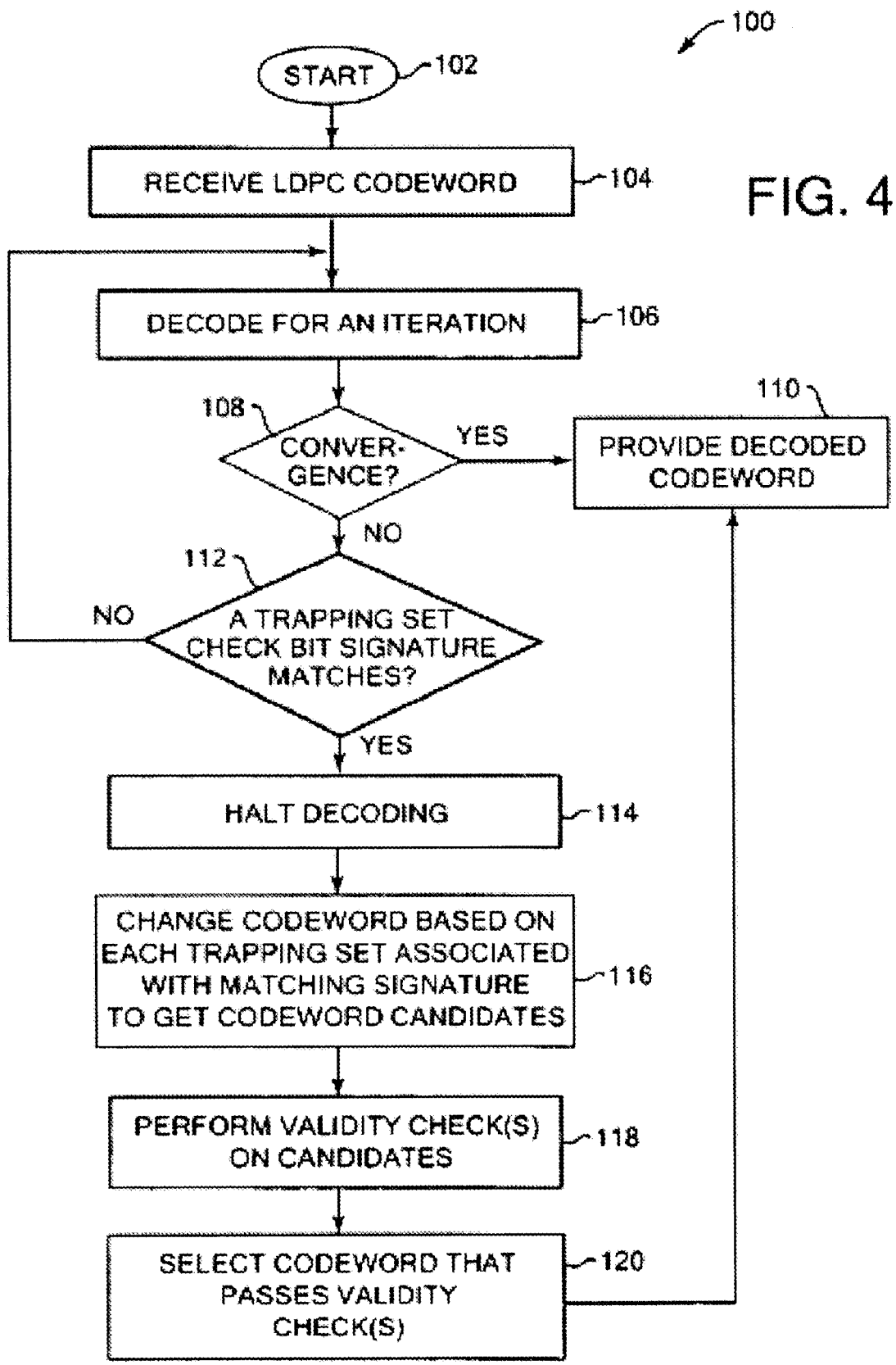
FIG. 4 is a flow diagram illustrating one embodiment of a method for decoding in accordance with the present disclosure.

FIG. 4 is a flow diagram illustrating one embodiment of a method 100 for decoding codewords including trapping sets. Method 100 can be implemented as software, hardware, or a combination of software and hardware. Software can be implemented as program instructions executed by one or more processors or computers, and provided on a computer readable medium, such as memory, magnetic storage, optical storage, or other types of media.

The process begins at 102, and in step 104, an LDPC codeword is received by the decoder. For example, in the 10 GBASE-T standard, PAM-16 symbols were received by a receiver (1024 PAM-16 symbols are received, as resulting from a 128-DSQ mapping at the encoding transmitter, where the 1024 PAM-16 symbols correspond to 512 128-DSQ symbols). Other embodiments can use other types of symbols. Estimates can then be extracted that are LLRs of coded bits, and the estimates passed to the LDPC decoder as the codeword. As explained above, a message-passing iterative decoder can be used to decode the 2048 bits that make up the 128-DSQ symbols for the LDPC encoded bits in a 10 GBASE-T frame implementation; other types of decoders and decoding methods can be used in other embodiments.

In step 106, the decoder performs decoding operations on the codeword for an iteration by the iterative decoder. In step 108, it is checked if there is convergence of the estimated values in the decoding process. If so, then the LDPC decoder has completed its decoding operation on this codeword, and in next step 110 the now-known coded bits (codeword) are provided. For example, the coded bits can be used to determine the most likely (i.e. closest) three uncoded bits in each 128-DSQ symbol, and a CRC-8 check can be performed on the resulting decoded frame to validate it (if the CRC check does not pass, the frame is marked as bad). Another codeword can also be received at step 104 if appropriate.

If there is no convergence found in step 108, then in step 112 the process checks whether a trapping set check bit signature matches check bits produced in the decoding operations and derived from the codeword. For example, 384 check bits are produced in 10 GBASE-T decoding, produced from the equations used by the decoder operation iteration. As described above, there are a known number of possible signatures of check bits that are associated with a known larger number of all possible trapping sets. All these signatures can be stored and compared to the check bits provided by the decoder to determine if any of those signatures match the check bits. A comparison can be performed for each signature until a match (if any) is found.

If no match is found, then no trapping set is detected and the process can return to step 108 to perform another decoding operation iteration (if appropriate for the decoder method). If a match is found, then it is known that a trapping set is detected, but not the exact, particular trapping set. In next step 116, the decoding operation of the decoder is halted, and in step 118, a current processed codeword is provided from the decoder to be changed based on each trapping set associated with the matching signature, to obtain a number of codeword candidates. A number of candidates are produced equal to the number of trapping sets that are associated with the matched signature, e.g., 4 candidates if the signature is associated with 4 trapping sets, 16 candidates if the signature is associated with 16 trapping sets, etc. the codeword is changed by flipping bits of the codeword that correspond to the trapping set. In the example embodiment described below for FIG. 5, the codeword is provided to the appropriate number of parallel uncoded bit slicers, each bit slicer changing the codeword according to a different associated trapping set, in parallel to save computation time.

In step 118, one or more validity checks are performed on the candidate codewords resulting from step 116. In the described embodiment, the validity checks include a Cyclic Redundancy Check (CRC)-8 check that is already provided in the 10 GBASE-T standard. Other checks can also be used, such as a frame continuity check (CRC-32 check), or other checks as described below. Thus, in the 10 GBASE-T embodiment, a codeword is checked for each trapping set in the group of 4, 8, 12, or 16 trapping sets associated with the matched signature.

In step 120, the codeword candidate is selected which passed the validity checks of step 120. This candidate is considered the final decoded codeword. Thus the process has determined which of the trapping sets makes the most sense to be present for the currently-processed codeword. The process then can continue to step 110 to provide the codeword, as explained above. Decoding can continue to be provided for any next codeword received.

In embodiments using CRC-8, if the assumption is made that the CRC-8s calculated with the incorrect trapping sets are essentially random, then there is a $1/256$ chance of a CRC matching. If the weighted average is calculated of the occurrences of the 4, 8, 12, or 16 group trapping set signatures, this corresponds to a 1.98% chance of hitting a trapping set that checks correctly, but is incorrect.

In some embodiments, more than one validity check is desirable. For example, more than one codeword candidate may pass a CRC-8 check or other single check, such that multiple trapping sets appear to be possible for the codeword. Thus, additional checks can be made on the codeword candidates to find a single candidate that passes all checks. For example, a combination of one or more of the following checks can additionally be made, until the codeword passes only one set of checks:

selecting the trapping set/candidate that produces the minimum uncoded slicing bit error;

check whether the start and end of a packet occurs within the transmitted frame, e.g., the start and end of an Ethernet packet within a 10 GBASE-T frame;

check whether packet lengths within the frame meet predetermined minimum and/or maximum values;

check for invalid ordered sets and control codes within the frame;

CRC-32 checks (or frame continuity checks) on packets within the frame, such as Ethernet packets within a 10 GBASE-T frame.

It is also possible to build an enhanced checking mechanism based on checking the contents of the 10 GBASE-T payload. Such a mechanism would look for packet start/stop continuity, correct packet lengths, and CRC-32 packet checks. The particular methods used can be left to the particular implementation, since this enhanced checking functionality may add size and complexity to the parallel uncoded bit slicers and checkers (see FIG. 5).

Thus the above method modifies the usual decoding sequence to provide trapping set decoding, by adding a number of parallel uncoded bit slicers and CRC-8 checkers, so that each possible trapping set combination can be examined and the CRC checked. The particular trapping set present is differentiated as the one that causes the CRC-8 (and/or any other checks) to pass, and is selected.

Figure 5:
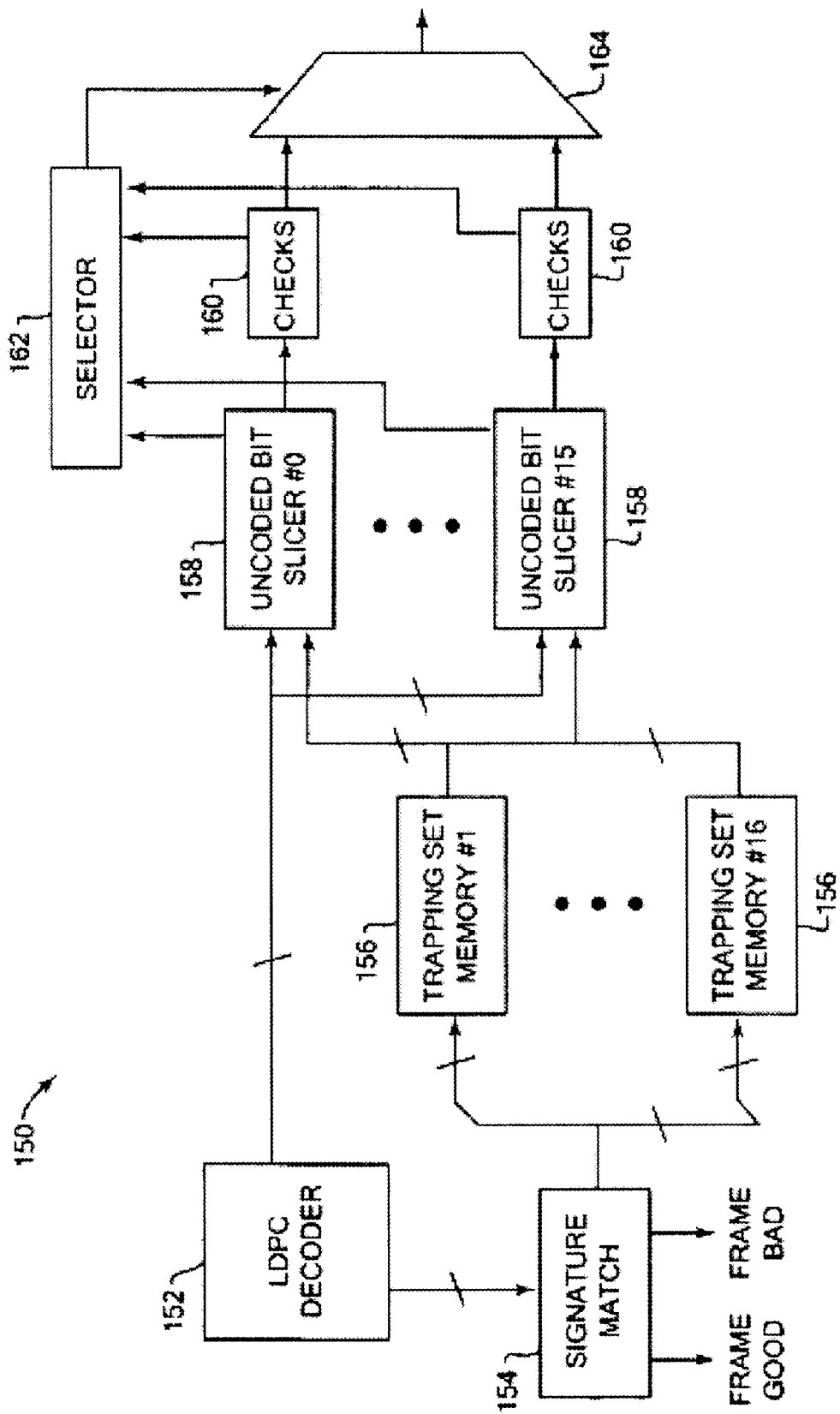
FIG. 5 is a block diagram illustrating one embodiment of a trapping set decoder that operates consistent with the method of FIG. 4.

FIG. 5 is a block diagram illustrating a trapping set decoder 150 that operates consistent with the validity checks method described in FIG. 4. Components specific to the described 10 GBASE-T embodiment are shown in FIG. 5, as well as examples for this specific implementation. In other embodiments, other components can be used.

An LDPC decoder 152 iteratively decodes the codeword. At every iteration, the check bits (e.g., 384 bits) are provided to a signature matching block 154 which compares the check bits to all the check node signatures associated with the possible trapping sets until a match is found. The signatures can be stored in one or more trapping set memories 156. The described embodiment shows sixteen memories 156, which organize the stored signatures and trapping sets so that they can be addressed by the matching block 154. For example, memory #1 may store entries for all 2328 signatures, while memory #16 can store entries only for those signatures associated with 16 trapping sets (32 signatures in the example herein). For example, the trapping sets that correspond to a given check bit signature can be stored as combinatorial lookup tables, or ROM. Factors such as size and power consumption can also be considered for which type of memory or memory structure to use. Other memory configurations can be used in other embodiments. The matching block 154 can also output status signals of "Frame Good" or "Frame Bad" to indicate the result of the matching to other system components.

If a match is found by the signature matching block 154, the LDPC decoding operation is halted and the currently "corrected" codeword is provided to a "selection processor" to determine which trapping set is present and to provide a decoded codeword for that trapping set. In the described embodiment, the selection processor includes a number of parallel uncoded bit slicers 158, where a number of bit slicers 158 are provided in the system equal to the maximum number of trapping sets that can be associated with a signature (16 in the described embodiment). The codeword is fed into a number of the bit slicers 158 equal to the possible number of trapping sets associated with the matched signature, and each different associated trapping set is loaded into one of these same bit slicers from the appropriate memories 156. Each bit slicer (in parallel) flips the bits of the received codeword that correspond to that bit slicer's received trapping set, so that each bit slicer produces a codeword candidate.

The codeword candidates are provided to checks block 160 which implements one or more validity checks on the received codeword candidates. For example, a CRC-8 check and other checks can be performed. One of the trapping sets/candidates will pass all of the checks; this is determined by a selector 162 that receives signals from the check blocks 160 and the slicers ISS. the selector 162 selects the particular trapping set/candidate that passes the checks of the check blocks 160 by selecting the output of the passed check block 160 using a multiplexer 164. This output is provided as the final decoded codeword.

Figure 6:
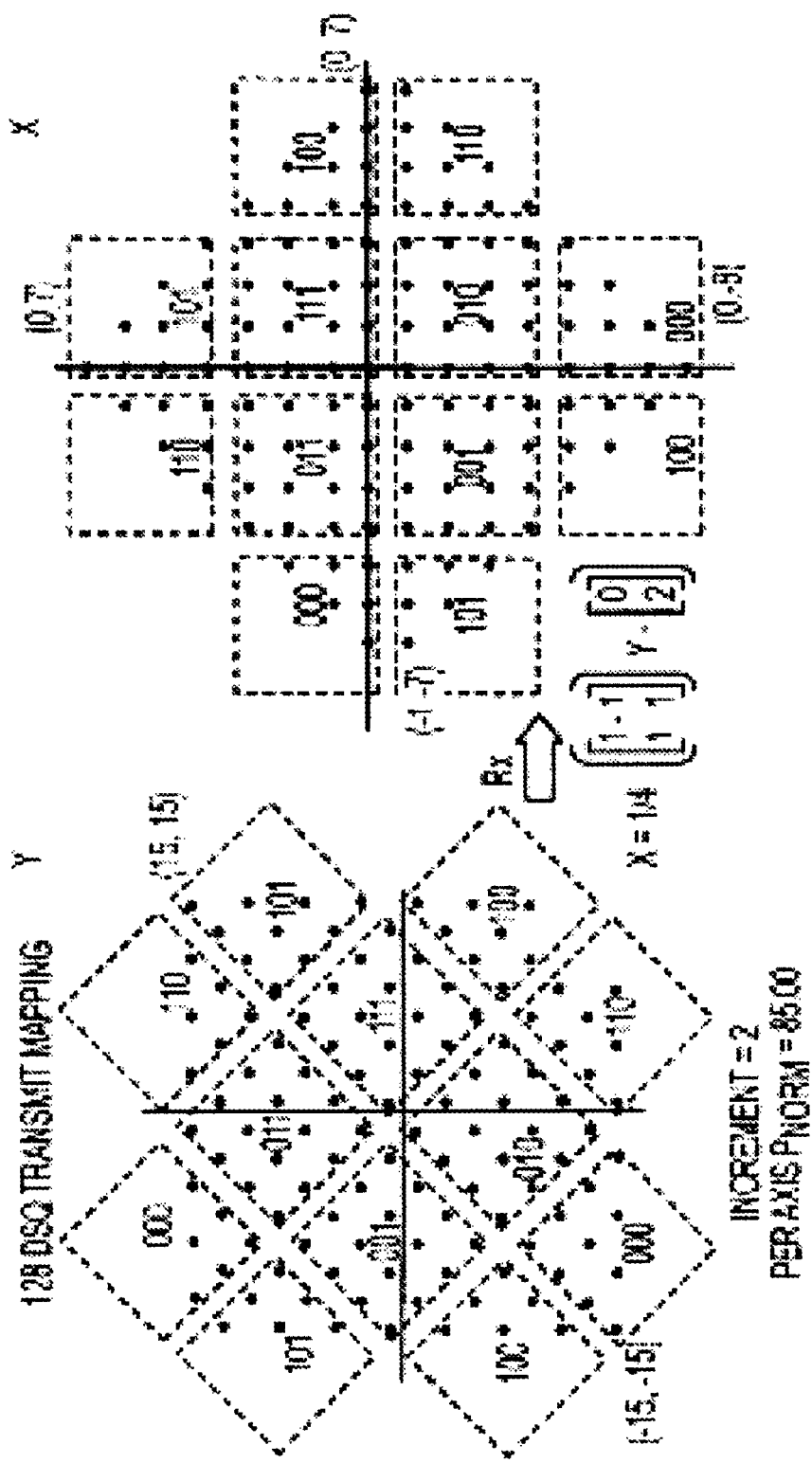
FIG. 6 illustrates an example of 128-DSQ transformation that can be performed prior to the uncoded bit slicing described herein.

FIG. 6 is a diagrammatic illustration of one example of 128-DSQ transformation that can be performed in some embodiments prior to the uncoded bit slicing described above with reference to FIGS. 4 and 5.

The uncoded bit slicing as performed by bit slicers 158 can be summarized as picking the closest coset to the known coded bits, given a received PAM-16 pair. For example, this can be accomplished by:

1) Performing the THP unwrapping, which is equivalent to a modulo 16 operation where received points that are greater than +16.0 map to −16.0, and vice versa.

Figure 2:
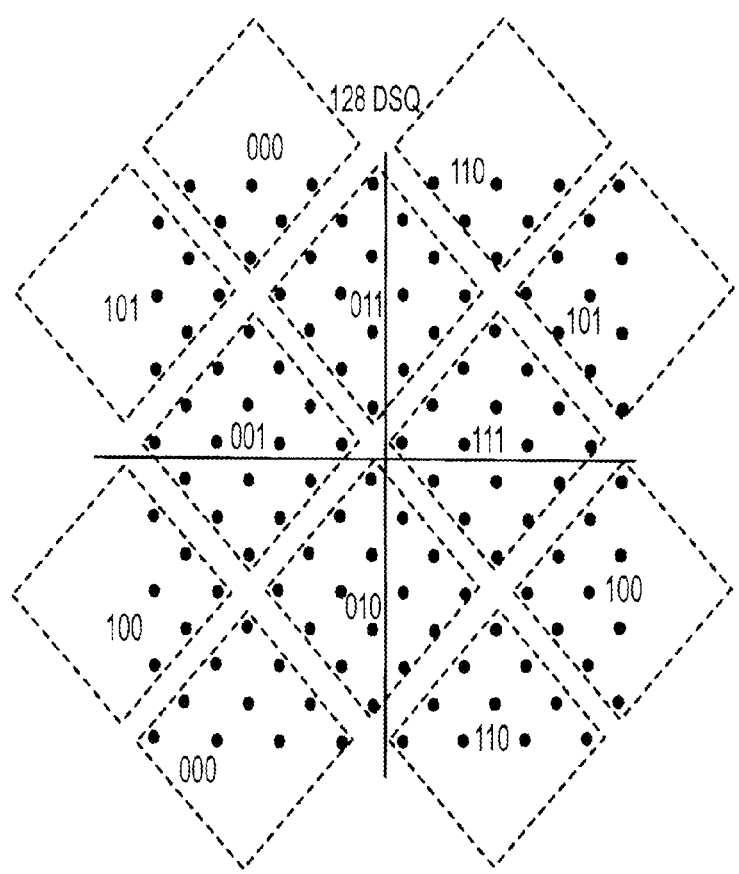
FIG. 2 illustrates a constellation for 128-DSQ modulation used in the standard of FIG. 1.
Figure 3:
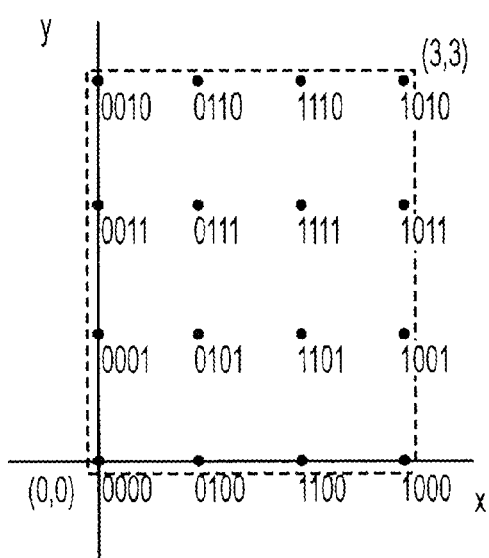
FIG. 3 illustrates labeling of points in a coset used with the constellation of FIG. 2.

2) Transforming the unwrapped, received 128-DSQ constellation (as in FIG. 2) so that each point is a distance of 1 away from each other on the x and y axes. This is accomplished using the transform shown in FIG. 6.

3) Knowing that the coded bits select the point within a coset, determine which coset contains points closest to the actual received PAM-16 value. Here the first two coded bits in the four bit coset symbol label are dependent on the x-axis value, and the second two coded bits in the four bit coset symbol label are only dependent upon the y-axis value.

The most direct way to determine these coset points is to utilize the power-of-2 structure of the mapped constellation, and do the equivalent of integer truncation on the mapped PAM-16 values, which means normalizing the coset point to zero, adding 0.5 to it, and then truncating the fractional part. In this mapped constellation, this corresponds to:

a) Subtracting the relative location of the coset symbol relative to the lower, left-hand point, where the relative location is as follows:

Relative location of coset symbol$(x, y)=(\{c_0, c_0Oc_1\}, \{c_2, c_2Oc_3\})$, where the coset's label is defined as $C_0C_1C_2C_3$.

b) Adding (2,2) to the point.

c) Truncating the fractional bits, which provides an (x,y) index which uniquely identifies the coset.

4) In order to simplify the truncation operation and avoid having to deal with negative numbers, the entire mapped constellation was shifted up and right by (12, 12), which corresponds to 3 cosets. Thus the indices into a lookup table for the uncoded bit slicer are:

$$x_{Index} = \text{int}(\text{Received}_x + 12.0 + 2.0 - \{c_0, C_0Oc_1\})$$
$$= \text{int}(\text{Received}_x + 14.0 - \{c_0, C_0Oc_1\})$$
$$y_{Index} = \text{int}(\text{Received}_y + 14.0 - \{c_2, c_2Oc_3\})$$

The associated uncoded bit slicing lookup table is shown in FIG. 7.

As an alternative to employing validity checks to determine the appropriate trapping set responsible for generating a detected error signature, the inventor has discovered that selecting an appropriate error pattern for a given syndrome may be straightforwardly based on the magnitude of probability metrics known as "intrinsics" for each of the bits in the different error patterns. Specifically, in one embodiment, the selection of an appropriate error pattern involves utilizing probability metrics in the form of log likelihood ratios that indicate one from a plurality of trapping set error patterns that may have caused a given error syndrome. Moreover, this selection scheme is useful not only for trapping sets of Order 8, but also for those of Order 10.

Figure 8:
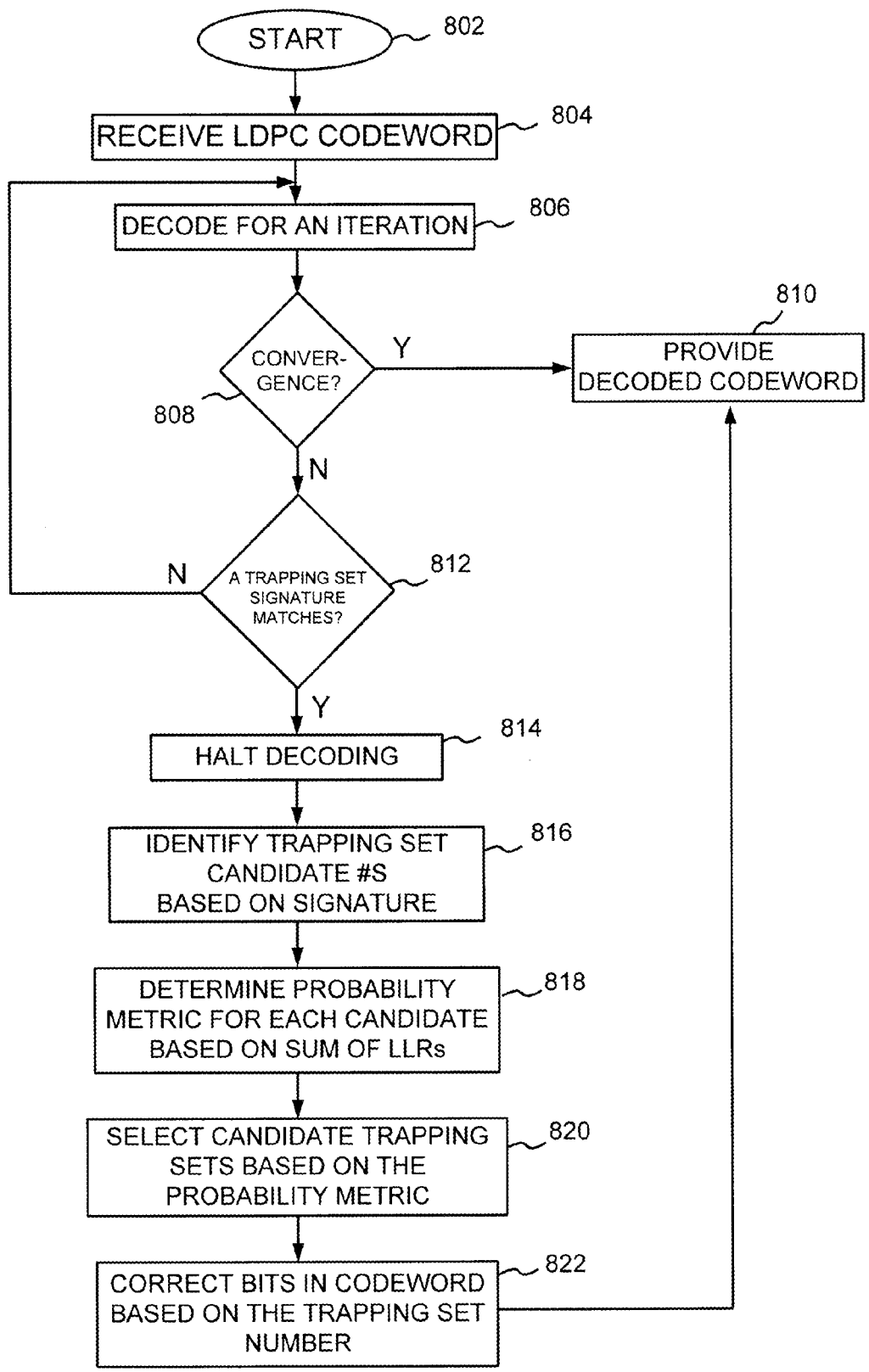
FIG. 8 illustrates a flow diagram illustrating a further embodiment of a method for decoding similar to FIG. 4.

FIG. 8 illustrates a method of decoding trapping sets, generally designated 800, similar to that disclosed with respect to FIG. 4, but identifying a trapping set from among a group of trapping sets that may have generated an error signature based on log likelihood ratios. The method begins at step 802 and proceeds to receiving an LDPC codeword, at step 804. The codeword is decoded over a first iteration, at step 806, then followed by a determination of whether a convergence of estimated values in the decoding process occurred, at step 808. If the estimated values converge, then the decoded codeword is provided for further processing, at step 810.

If the estimated values do not converge, at step 808, then a further determination is carried out as to whether a portion of the estimated values exhibit a trapping set signature, at step 812. If no signature is detected, then the iterating and converging steps at 806 and 808 are repeated. If a trapping set signature is detected, then the LDPC decoding is halted, at step 814, and a group of trapping set error patterns, or candidates, identified based on the detected signature, at step 816. Identification of the trapping set candidates may be predetermined and stored in a lookup table and carried out through a straightforward matching operation.

With the trapping set signature detected, and trapping set error patterns identified, a probability metric is calculated, at step 818, for each set of trapping set bits. In one embodiment, the probability metric comprises a sum of the log likelihood ratios (LLR) for the bits in each trapping set. In a more specific embodiment, this involves summing the upper "most-significant-bits" (MSBs) of the intrinsic magnitude values. The inventor has discovered that, in one specific embodiment, the sum having the lowest value is a highly accurate indicator of the trapping set error pattern that generated the error signature. Thus, the method proceeds by identifying the lowest LLR sum, and selecting the trapping set corresponding to that sum, at step 820. Bits in the decoded codeword are then corrected based on the specific trapping set identified.

As an example of the method described above, Table 1 below shows a tabulation of all of the possible trapping set numbers for a given signature of Order 8, and LLRs for the respective trapping set bits. A similar table may be straightforwardly generated for trapping sets of Order 10. For this particular signature of Order 8, there are 12 corresponding trapping sets—any one of which that could have possibly generated the error syndrome (or signature). As seen from the table, each LLR for each bit is shown ranging from a maximum likelihood value of 31 (very likely a correct bit) to a low likelihood value of 1 (very likely an incorrect bit). These values are known as the "intrinsic", and were referred to above. From the table, with the LLR sum of 61 for trapping set #9 being the lowest value, that trapping set will be used to correct the decoded codeword bits by "flipping" the appropriate bits, as described earlier. In this manner, the error pattern selection for a given syndrome may be based on the magnitude of the intrinsic for each of the bits in the different error patterns.

TABLE 1

| Subset # | T/S # | LLR Sum | Log Liklihood Ratios for Each Bit |
|---|---|---|---|
| 0 | 252 | 222 | 21 31 18 31 31 31 28 31 |
| 1 | 536 | 248 | 31 31 31 31 31 31 31 31 |

TABLE 1-continued

| Subset # | T/S # | LLR Sum | Log Liklihood Ratios for Each Bit |
|---|---|---|---|
| 2 | 576 | 248 | 31 31 31 31 31 31 31 31 |
| 3 | 2138 | 244 | 31 31 31 31 31 31 31 27 |
| 4 | 3872 | 245 | 31 31 31 31 31 31 31 28 |
| 5 | 3952 | 248 | 31 31 31 31 31 31 31 31 |
| 6 | 3991 | 244 | 31 31 31 31 31 31 27 31 |
| 7 | 4093 | 242 | 31 31 31 31 31 31 25 31 |
| 8 | 7637 | 248 | 31 31 31 31 31 31 31 31 |
| 9 | 7695 | 61 | 7 20 12 10 3 3 1 5 |
| 10 | 7855 | 248 | 31 31 31 31 31 31 31 31 |
| 11 | 8275 | 244 | 31 31 27 31 31 31 31 31 |

Figure 9:
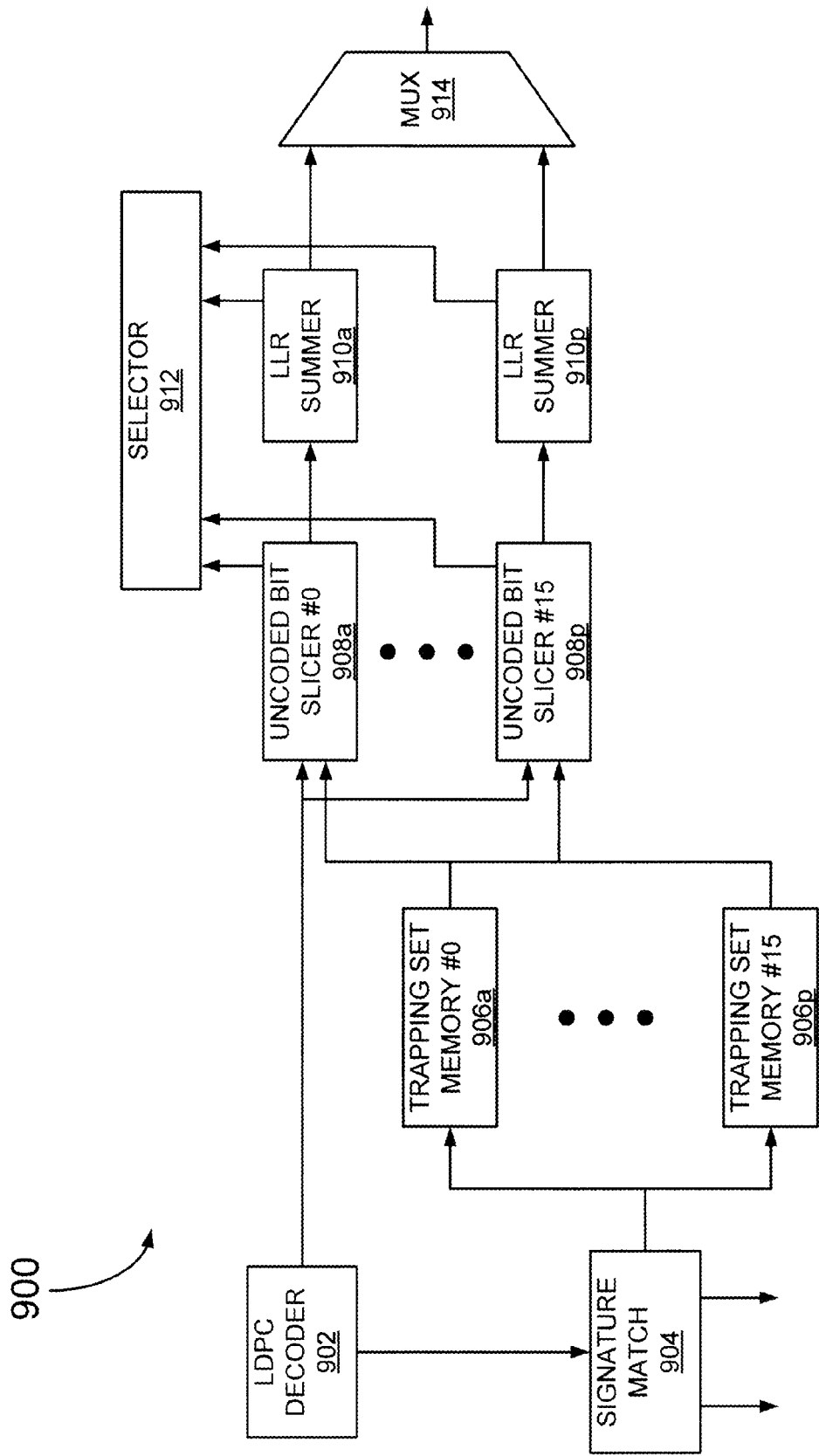
FIG. 9 is a block diagram illustrating a further embodiment of a trapping set decoder that operates consistent with the method of FIG. 8.

FIG. 9 illustrates a block diagram of a receiver circuit, generally designated 900, that employs circuitry to carry out the method described above with respect to FIG. 8. Much of the circuitry is similar to that presented in FIG. 5, including an LDPC decoder 902, a signature matching circuit 904, trapping set memories 906a-906p, and uncoded bit slicer circuits 908a-908p. To carry out the log likelihood ratio summing, respective LLR summing circuits 910a-910p are employed to generate LLR sums for each trapping set and feed the sum to a selection processor 912. The selection processor then generates a control signal to multiplexer 914 specifying which trapping set to select for the multiplexer output. This output is provided as the final decoded codeword.

The disclosure herein provides embodiments of trapping set decoders to augment the LDPC decoder present in a 10 GBASE-T or similarly-operating receiver, allowing the error floor caused by trapping sets to be eliminated. Using CRC-8, LLRs or other information associated with the 10 GBASE-T transmission frame, or using other similar information included in a different format, allows the selection of the correct trapping set for trapping set decoding.

Although the disclosure herein has been described in accordance with the embodiments shown, one of ordinary skill in the art will readily recognize that there could be variations to the embodiments and those variations would be within the spirit and scope of the disclosure. Accordingly, many modifications may be made by one of ordinary skill in the art without departing from the spirit and scope of the appended claims.

What is claimed is:

1. A trapping set decoder comprising:
    a detector including an input to receive a decoded codeword and including circuitry to detect the presence of one or more trapping sets of bits in the decoded codeword; and
    a selection processor coupled to the detector to select one from a group of trapping sets and correct one or more bits in the decoded codeword based on statistical measures associated with the one or more trapping sets of bits.

2. The trapping set decoder of claim 1 wherein the decoded codeword is a decoded LDPC codeword.

3. The trapping set decoder of claim 1 wherein the trapping sets of bits are of Order 8.

4. The trapping set decoder of claim 1 wherein the trapping sets of bits are of Order 10.

5. The trapping set decoder of claim 1 wherein the statistical measures comprise log likelihood ratios.

6. The trapping set decoder of claim 5 and further comprising summing circuitry to generate a log likelihood sum of the log likelihood ratios for each of the trapping sets, and wherein the selection of one from a group of trapping sets is based on the sums of the log likelihood ratios of the bits for each of the group of trapping sets.

7. The trapping set decoder of claim 1 wherein the trapping set decoder is embodied in a 10 GBASE-T receiver circuit.

8. The trapping set decoder of claim 1 wherein the detector detects a signature that corresponds to the one or more trapping sets of bits.

9. A method for decoding trapping sets, the method comprising:
    receiving a decoded codeword;
    determining whether at least a portion of the decoded codeword exhibits a trapping set signature;
    identifying a group of trapping set error patterns corresponding to the trapping set signature;
    selecting a trapping set error pattern from the identified group of trapping set error patterns based on probability metrics associated with the respective trapping set error patterns.

10. The method of claim 9 wherein the probability metrics comprise log likelihood ratios.

11. The method of claim 10 wherein the selecting comprises summing a plurality of the log likelihood ratios for at least a plurality of the bits in each identified trapping set.

12. The method of claim 9 and further comprising correcting bits in the received codeword based on the selected trapping set.

13. The method of claim 9 wherein receiving comprises receiving an LDPC decoded codeword.

14. A receiver circuit comprising:
    an LDPC decoder; and
    a trapping set decoder including
        a detector including an input to receive a decoded codeword and including circuitry to detect the presence of one or more trapping sets of bits in the decoded codeword and
        a selection processor coupled to the detector to select one from a group of trapping sets and correct one or more bits in the decoded codeword based on statistical measures associated with the one or more trapping sets of bits.

15. The receiver circuit of claim 14 wherein the receiver circuit is embodied in an ethernet transceiver.

16. The receiver circuit of claim 15 wherein the ethernet transceiver comprises a 10 GBASE-T ethernet transceiver.

* * * * *